(12) United States Patent
Kim et al.

(10) Patent No.: US 8,497,505 B2
(45) Date of Patent: Jul. 30, 2013

(54) THIN FILM CHARGED BODY SENSOR

(75) Inventors: Mu-Gyeom Kim, Yongin (KR);
Chang-Mo Park, Yongin (KR); Il-Soo Park, Yongin (KR); Yong-Soo Lee, Yongin (KR); Young-Mi Cho, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 170 days.

(21) Appl. No.: 13/209,464

(22) Filed: Aug. 15, 2011

(65) Prior Publication Data

US 2012/0043547 A1 Feb. 23, 2012

(30) Foreign Application Priority Data

Aug. 18, 2010 (KR) ........................ 10-2010-0079850

(51) Int. Cl.
*H01L 29/417* (2006.01)
(52) U.S. Cl.
USPC .................. 257/57; 257/59; 257/66; 257/72; 257/E29.117
(58) Field of Classification Search
USPC ........................ 257/57, 59, 66, 72, E29.117
See application file for complete search history.

(56) References Cited

U.S. PATENT DOCUMENTS

| | | | |
|---|---|---|---|
| 6,028,581 A | 2/2000 | Umeya | |
| 6,157,066 A * | 12/2000 | Kobayashi | 257/363 |
| 6,819,316 B2 | 11/2004 | Schulz et al. | |
| 6,924,183 B2 * | 8/2005 | Mori | 438/197 |
| 2002/0142526 A1 * | 10/2002 | Khare et al. | 438/152 |
| 2007/0292997 A1 * | 12/2007 | Maruyama et al. | 438/166 |
| 2012/0235153 A1 * | 9/2012 | Murakami et al. | 257/72 |
| 2013/0009289 A1 * | 1/2013 | Arai et al. | 257/664 |

FOREIGN PATENT DOCUMENTS

| | | |
|---|---|---|
| JP | 2010-056303 A | 3/2010 |
| KR | 10-2003-0023637 A | 3/2003 |
| KR | 10-2004-0052225 A | 6/2004 |
| KR | 10-2007-0066069 A | 6/2007 |
| KR | 10-2008-0062263 A | 7/2008 |
| KR | 10-2009-0006543 A | 1/2009 |

\* cited by examiner

*Primary Examiner* — Victor A Mandala
(74) *Attorney, Agent, or Firm* — Lee & Morse, P.C.

(57) ABSTRACT

A thin film charged body sensor for sensing a contact and/or non-contact movement of a charged body based on an electric field of the charged body. The thin film charged body sensor may include a substrate, a first thin film transistor unit on the substrate, and including a gate layer, an active layer insulated from the gate layer, and source/drain layers insulated from the gate layer and connected to the active layer; and a thin film antenna unit on the substrate, and including a first film including a conductive material electrically connected to the gate layer, the thin film antenna unit adapted to generate an input current in response to an electric field of a charged body.

20 Claims, 9 Drawing Sheets

THIN FILM CHARGED BODY SENSOR

BACKGROUND

1. Field

Embodiments relate to a charged body sensor for sensing a contact or non-contact movement of a charged body, and more particularly, to a thin film charged body sensor having a structure in which a plurality of thin films are stacked.

2. Description of the Related Art

Contact-type input methods of sensing a touch are more widely being used in small display devices such as mobile phones. Such contact-type input methods are also being employed in large display devices such as televisions (TVs).

SUMMARY

It is a feature of an embodiment to provide a thin film charged body sensor that may be integrally manufactured during a thin film stacking process of a general flat panel display device.

It is a separate feature of an embodiment to provide a thin film charged body sensor that may sense a user's manipulation during a contact state and a non-contact state.

It is a separate feature of an embodiment to provide a thin film charged body sensor that may be manufactured using a thin film stacking process useable to form a general flat panel display device, and may enable sensing a user's manipulation in a contact state and in a non-contact state.

At least one of the above and other features and advantages may be realized by providing a thin film charged body sensor, including a substrate, a first thin film transistor unit on the substrate, and including a gate layer, an active layer insulated from the gate layer, and source/drain layers insulated from the gate layer and connected to the active layer, and a thin film antenna unit on the substrate, and including a first film including a conductive material electrically connected to the gate layer, the thin film antenna unit adapted to generate an input current in response to an electric field of a charged body.

The first film and the gate layer may include a same material.

The first film may be integrally connected to the gate layer.
The first film may extend from the gate layer.
The first film and the source/drain layers may include a same material.

The sensory may further include a second thin film transistor unit, wherein the first film is electrically connected to a gate layer of the second thin film transistor unit.

The thin film antenna unit may further include a second film including a conductive material, the second film being insulated from the first film.

The sensor may further include a second thin film transistor unit, wherein the second film may be electrically connected to a gate layer of the second thin film transistor unit.

The sensor may further include a second thin film transistor unit, wherein the second film may be electrically connected to source/drain layers of the second thin film transistor unit.

The thin film antenna unit may further include a third film including a conductive material insulated from the first film.

The second film and the third film may be electrically connected to each other.

A plurality of the thin film antenna units may be provided, and a plurality of the thin film transistor units may be respectively connected to the plurality of thin film antenna units.

The plurality of thin film antenna units may extend in different directions on a panel on which a sensing operation is performed.

The sensor may further include an insulating layer covering the thin film antenna unit.

The active layer may include an oxide semiconductor.
The gate layer may be under the active layer.
The gate layer may be above the active layer.

At least one of the above and other features and advantages may be realized by providing a display device, including a display panel, and a thin film charged body sensor, the thin film charged body sensor including a substrate, a first thin film transistor unit on the substrate, a gate layer, an active layer insulated from the gate layer, source/drain layers insulated from the gate layer and connected to the active layer, and a thin film antenna unit on the substrate, the thin film antenna unit including a first film including a conductive material electrically connected to the gate layer, the thin film antenna unit being adapted to generate an input current in response to an electric field of a charged body.

The first film may be integrally connected to the gate layer.
The first film may extend from the gate layer.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1A:
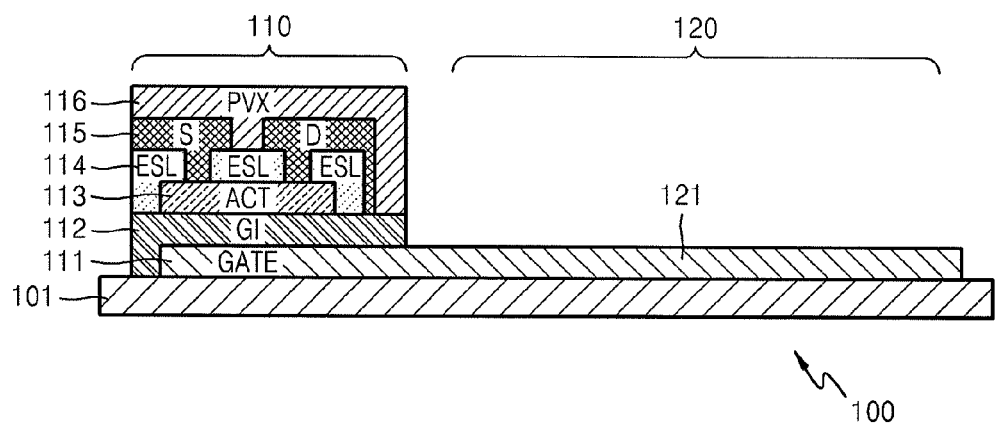
FIGS. 1A and 1B illustrate a cross-sectional view and a top-plan view, respectively, of a thin film charged body sensor according to an exemplary embodiment.

Korean Patent Application No. 10-2010-0079850, filed on Aug. 18, 2010, in the Korean Intellectual Property Office, and entitled: "Thin Film Charged Body Sensor," is incorporated by reference herein in its entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when an element is referred to as being "on," "above", "below," or "under" another element, it can be directly "on," "above", "below," or "under" the other element, respectively, or intervening elements may also be present. In addition, it will also be understood that when an element is referred to as being "between" two elements, it can be the only element between the two elements, or one or more intervening elements may also be present.

It will be also be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. Like reference numerals refer to like elements throughout the specification.

Figure 1B:
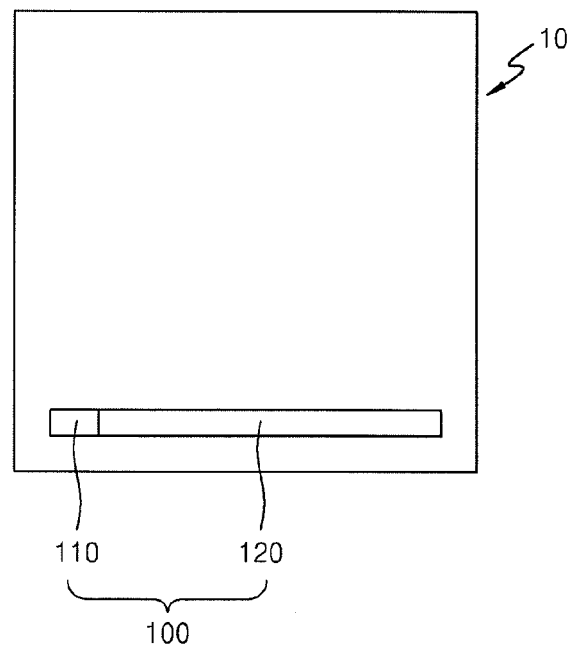

FIGS. 1A and 1B illustrate a cross-sectional view and a top-plan view, respectively, of a thin film charged body sensor 100 according to an exemplary embodiment. More particularly, FIG. 1A illustrates a cross-sectional view of an exemplary structure of the thin film charged body sensor 100 including a plurality of stacked thin films. FIG. 1B illustrates a plan view of the thin film charged body sensor 100 arranged on a panel 10 on which a sensing operation may be performed.

Referring to FIGS. 1A and 1B, the thin film charged body sensor 100 may include a thin film transistor unit 110 and a thin film antenna unit 120. The thin film antenna unit 120 may generate an input current in response to an electric field of an adjacent charged body (not shown). The thin film transistor unit 110 may output a sensing signal according to the input current. That is, when a charged body, e.g., a user's finger, approaches the thin film antenna unit 120, an input current may be generated by the thin film antenna unit 120 due to an electric field of the charged body. The thin film transistor unit 110 connected to the thin film antenna unit 120 may then output a sensing signal based on the input current. In other words, a sensing signal corresponding to an electric field of an adjacent charged body may be generated due to the electric field.

Referring to FIG. 1A, the thin film transistor unit 110 and the thin film antenna unit 120 may each include a stacked structure in which a plurality of thin film layers are stacked. Instead of requiring installation of a separate complex antenna device on, e.g., a display device, embodiments may enable the thin film antenna unit 120 and the thin film transistor unit 110 to be simultaneously formed during formation of thin film layers of a display device. More particularly, e.g., in embodiments, the thin film layers of the thin film transistor unit 120 and the thin film antenna unit 120 may be formed while forming thin film layers of, e.g., a flat panel display device, e.g., using a same process. More particularly, e.g., since the thin film transistor unit 110 may have a stacked structure similar to that of a thin film transistor included in a display unit of the general flat panel display device, the thin film antenna unit 120 may be integrally formed from portions of the thin film layers of the thin film transistor unit 110. Thus, the thin film transistor unit 110 and the thin film antenna unit 120 may be simultaneously formed during a same film formation process. Accordingly, if the thin film charged body sensor 100 is included in, e.g., a flat panel display device, the thin film charged body sensor 100 may be simultaneously formed during formation of the display unit. It should be understood that while a display unit may be described as an exemplary application of embodiments of a thin film charged body sensor described herein, e.g., thin film charged body sensor 100, embodiments may be employed in various applications. Further, for this reason, in the following description, exemplary stacked structures of thin film layers will be explained without directly resorting to a flat panel display device.

Referring to FIG. 1A, the thin film transistor unit 110 may include a gate layer 111, a gate insulating layer 112, an active layer 113, an etch stop layer 114, source/drain layers 115, and a passivation layer 116 on a substrate 101. The gate layer 111, the gate insulating layer 112, the active layer 113, the etch stop layer 114, the source/drain layers 115, and the passivation layer 116 may be sequentially stacked on the substrate 101. The gate layer 111 may be electrically insulated from the active layer 113. The source/drain layers 115 may be insulated from the gate layer 111. The source/drain layers 115 may be connected to the active layer 113. The thin film transistor unit 110 may be turned on when a predetermined voltage is applied to the gate layer 111, like a general thin film transistor. A voltage applied to the gate layer 111 may correspond to an input signal supplied from the thin film antenna unit 120. That is, e.g., the input signal supplied from the thin film antenna unit 120 may be based on, e.g., a contact and/or non-contact movement of a charged body, e.g., a finger, relative to the panel 10. Accordingly, a current flowing through the source/drain drain layers 115 may correspond to a sensing signal to be output to a predetermined sensing circuit (not shown).

The thin film antenna unit 120 may include a first film 121 including a same material as the gate layer 111. More particularly, e.g., the first film 121 may be formed as an extension of the gate layer 111. That is, the first film 121 and the gate layer 111 may be integrally formed as a single layer (121+111), and a portion of the single layer (121+111) corresponding to the thin film antenna unit may correspond to the gate layer 111 and a portion of the single layer (121+111) corresponding to the thin film antenna unit 120 may correspond to the first film 121. The first film 121 and the gate layer 111 may include a conductive material. The first film 121 may generate an input current in response to an ambient electric field.

The thin film charged body sensor 100 of FIG. 1 may be formed as follows.

Referring to FIG. 1A, the gate layer 111 of the thin film transistor unit 110 and the first film 121 of the thin film antenna unit 120 may be formed on the substrate 101. The gate layer 111 and the first film 121 may include a conductive metal material, e.g., molybdenum, indium tin oxide (ITO), etc. Referring to FIG. 1A, the thin film antenna unit 120 may have a stacked structure, and processing may continue to form additional stacked layers of the thin film transistor unit 110.

Referring to FIG. 1A, the gate insulating layer 112 may be formed on the gate layer 111. The gate insulating layer 112 may include an insulating material, e.g., silicon oxide, tantalum oxide, and/or aluminum oxide, etc. The active layer 113 may be formed on the gate insulating layer 112. The active layer 113 may include, e.g., a silicon semiconductor, and/or an oxide semiconductor such as GaInZnOx (GIZO), HfInZnOx (HIZO), etc.

Figure 9A:
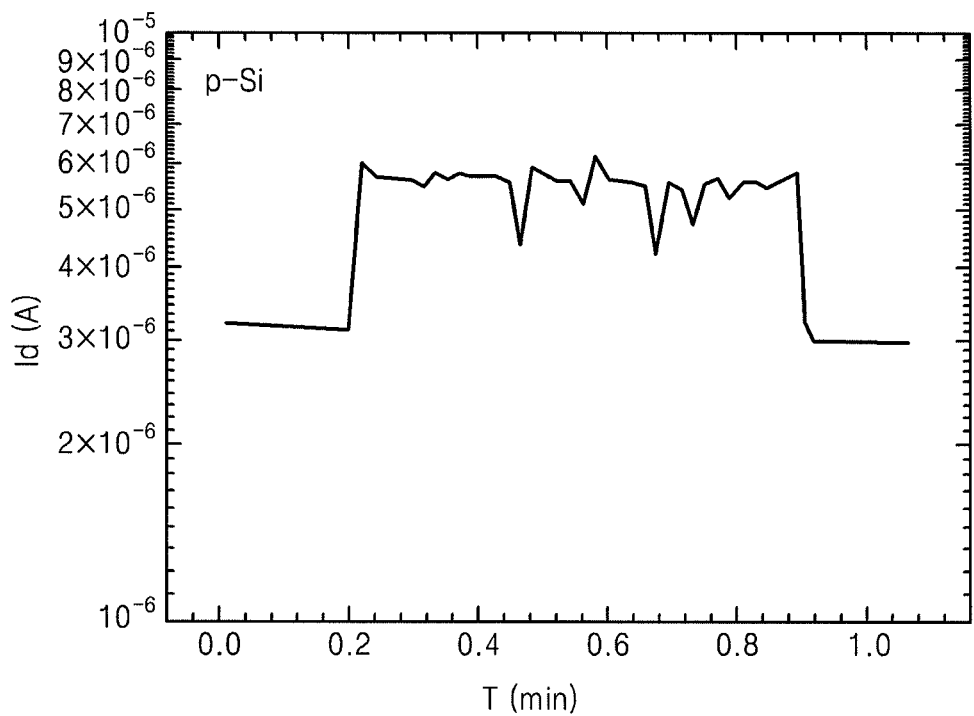
FIG. 9A illustrates a graph of measured current of a sensing signal output from a thin film charged body sensor of an embodiment including an active layer including polysilicon.
Figure 9B:
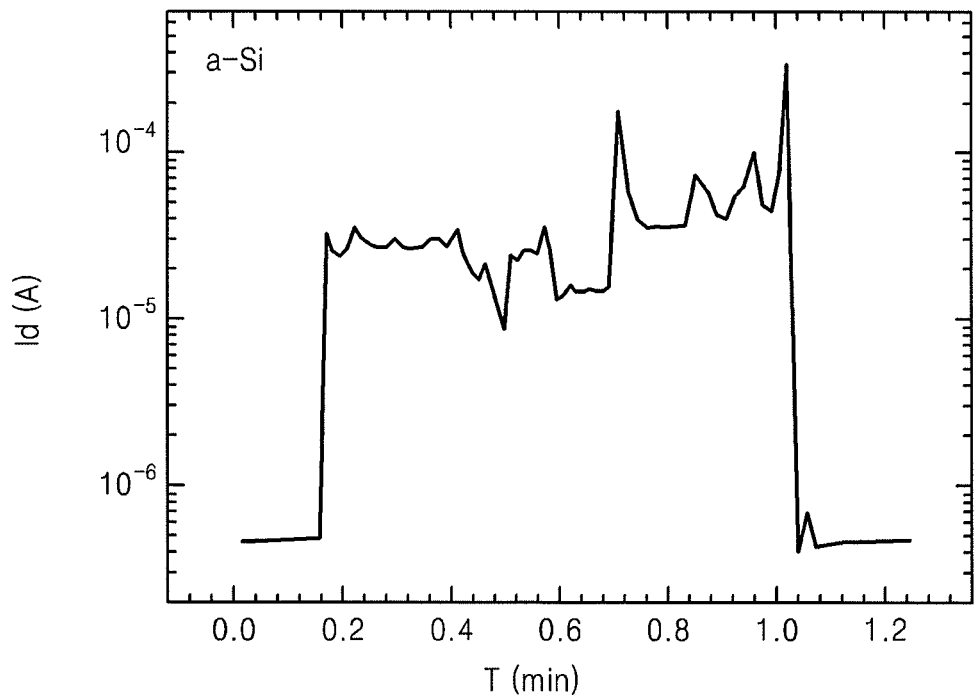
FIG. 9B illustrates a graph of measured current of a sensing signal output from a thin film charged body sensor of an embodiment including an active layer including amorphous silicon.
Figure 9C:
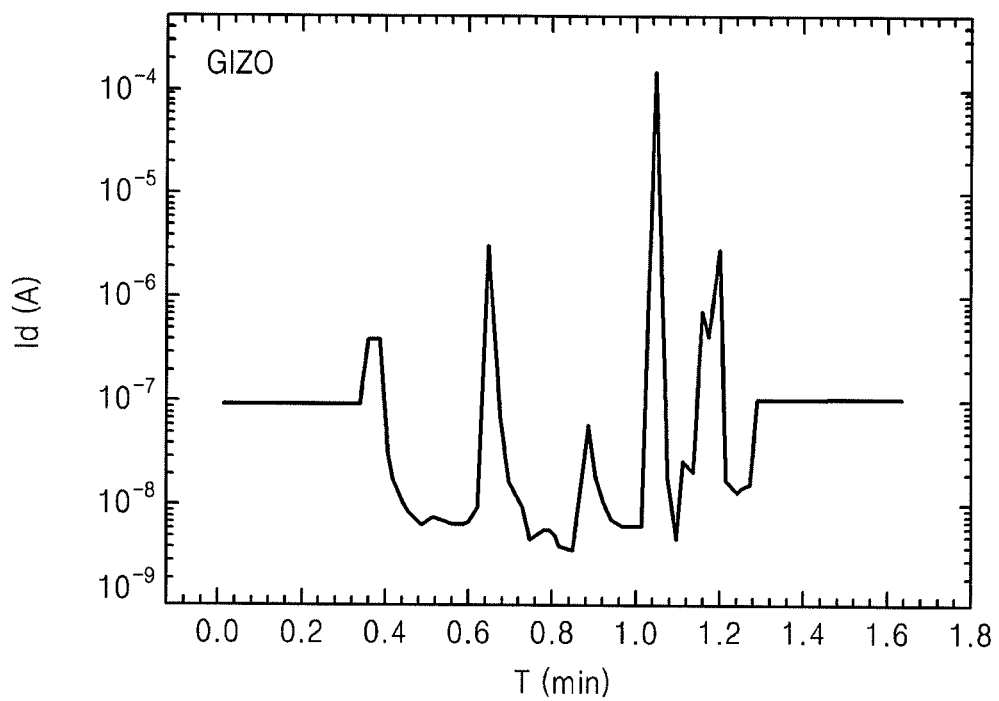
FIG. 9C illustrates a graph of measured current of a sensing signal output from a thin film charged body sensor of an embodiment including an active layer including an oxide semiconductor.

Through experimentation, it has been determined that an oxide semiconductor ensures a better sensitivity than a silicon semiconductor. FIG. 9A illustrates a graph of measured current of a sensing signal output from a thin film charged body sensor of an embodiment in which the active layer 113 includes polysilicon. FIG. 9B illustrates a graph of measured current of a sensing signal output from a thin film charged body sensor of in which the active layer 113 includes amorphous silicon. FIG. 9C illustrates a graph of measured current of a sensing signal output from a thin film charged body sensor of an embodiment in which the active layer 113 includes an oxide semiconductor. Referring to FIGS. 9A through 9C, it may be seen that a sensing signal output to a sensing circuit (not shown) may vary with a much larger width when the active layer 113 is formed of GIZO than when the active layer 113 is formed of polysilicon or amorphous silicon. That is, when measuring a sensing signal output while a charged body approaches and moves in a similar manner around the thin film antenna unit 120 in each of the cases, a change in the sensing signal when the active layer 113 includes an oxide semiconductor, as shown in FIG. 9C, is relatively higher. More particularly, referring to FIGS. 9A through 9C, movement of the charged body may be sensed with relatively higher sensitivity in embodiments in which the active layer 113 includes an oxide semiconductor, e.g., GIZO. Accordingly, relative to polysilicon and amorphous silicon, embodiments including the active layer 113 including an oxide semiconductor may provide the highest sensor sensitivity.

Referring to FIG. 1A, the etch stop layer 114 may be formed on the active layer 113. The etch stop layer may include, e.g., an insulating material similar to that of the gate insulating layer 112. The source/drain layers 115 may be formed on the etch stop layer 114. The source/drain layers 115 may include a conductive material, e.g., ITO. The passivation layer 116 may be formed on the source/drain layers 115. The passivation layer 116 may include an insulating material similar to that of the gate insulating layer 112. Referring to FIG. 1A, a combination of the substrate 101, the gate layer 111, the gate insulating layer 112, the active layer 13, the etch stop layer 114, the source/drain regions 115, and the passivation layer 116 may provide the thin film charged body sensor 100.

Referring to FIG. 1B, the thin film charged body sensor 100 formed as described above may be arranged on the panel 10. When a user's charged body, such as a finger, approaches or contacts the panel 10, the first film 121 of the thin film antenna unit 120 may generate an input voltage due to an electric field of the charged body, and, as a result of the input voltage, the thin film transistor unit 110 may be turned on, and a sensing signal (e.g., FIGS. 9A through 9C) may be output to a predetermined sensing circuit (not shown).

Hence, the thin film charged body sensor 100 may sense a movement of a charged body according to this principle, and the sensing circuit (not shown) may receive and appropriately process a sensing signal in various applications. In embodiments, because the thin film charged body sensor 100 may output a sensing signal in response to an ambient electric field, the sensing signal may be generated and accordingly processed in a state where a charged body directly contacts the thin film antenna unit 120 and/or in a state where a charged body does not contact the thin film antenna unit 120. Accordingly, the thin film charged body sensor 100 may be applied to even more devices and/or various applications.

Embodiments are not limited to the features described above in relation to FIG. 1. Some exemplary variations will be described below. For example, in the exemplary embodiment of FIG. 1, the gate layer 111 is illustrated as being disposed under the active layer 113. However, embodiments are not limited thereto. More particularly, e.g., features described herein may be employed for thin film charged body sensors including a thin film transistor selectively having a bottom gate structure in which a gate layer is disposed under an active layer (see, e.g., FIG. 1) or a top gate structure in which a gate layer is disposed over an active layer (see, e.g., FIG. 2).

Figure 2:
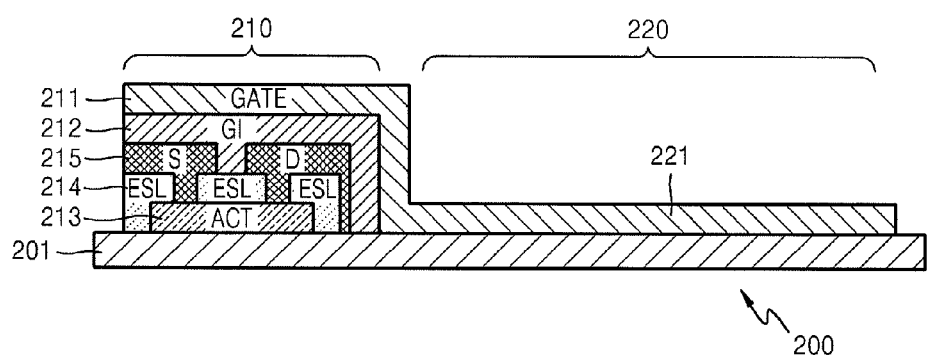
FIG. 2 illustrates a cross-sectional view of a thin film charged body sensor according to another exemplary embodiment.

FIG. 2 illustrates a cross-sectional view of a thin film charged body sensor 200 according to another exemplary embodiment. In general, only differences between the exemplary thin film charged body sensor 200 of FIG. 2 and the thin film charged body sensor 100 of FIG. 1A will be described below. The thin film charged body sensor 200 of FIG. 2 may include a thin film transistor unit 210 and a thin film antenna unit 220 on a substrate 201. The thin film transistor unit 210 may include a gate layer 211, a gate insulation layer 212, an active region 215, etch stop layer 214, and source/drain regions 215 stacked on the substrate 201. The thin film antenna unit 220 may include a first film stacked on the substrate 201.

More particularly, in contrast to the thin film charged body sensor 100 of FIG. 1, in the thin film charged body sensor 200 of FIG. 2, the gate layer 211 and the gate insulation layer 212 are disposed over the active layer 213. Thus, the gate layer 211 of the thin film charged body sensor 200 may be selectively arranged. Referring to FIG. 2, the thin film transistor unit 210 may be formed by sequentially stacking the active layer 213, the etch stop layer 214, the source/drain layers 215, the gate insulating layer 212, and the gate layer 211 on the substrate 201. The first film 221 of the thin film antenna unit 220 may be formed as an extension of the gate layer 211.

Referring to FIG. 2, when a charged body approaches or contacts the thin film antenna unit 220, the first film 221 may generate an input current due to an electric field of the charged body. When a predetermined voltage is applied to the gate layer 211 of the thin film transistor unit 210 due to the input current, the thin film transistor unit 210 may be turned on such that a sensing signal may be output. Hence, the thin film charged body sensor 200 may sense a movement, such as a contact or approach (i.e., non-contact), of a charged body due to an electric field, and a sensing circuit may receive and appropriately process a sensing signal in various applications.

Figure 3:
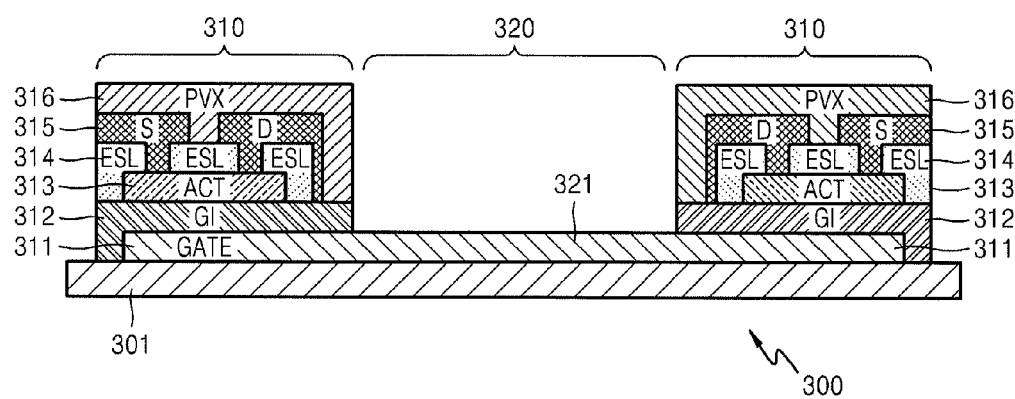
FIG. 3 illustrates a cross-sectional view of a thin film charged body sensor according to another exemplary embodiment.

FIG. 3 illustrates a cross-sectional view of a thin film charged body sensor 300 according to another exemplary embodiment. In general, only differences between the exemplary thin film charged body sensor 300 of FIG. 3 and the thin film charged body sensor 100 of FIG. 1A will be described below. More particularly, the thin film charged body sensor 300 of FIG. 3 includes a plurality thin film transistor units 310, e.g., two thin film transistor units, coupled to one thin film antenna unit 320. By providing a plurality of the thin film transistor units 310, each of the thin film transistor units 310 may be turned on in response to a same sensed movement, e.g., contact and/or non-contact, of a charged body due to an electric field, and may generate a respective sensing signal, and a combination of the respective sensing signals may result in an amplified sensing signal.

More particularly, referring to FIG. 2, the thin film charged body sensor 300 of FIG. 2 may include, e.g., two thin film transistor units 310 and a thin film antenna unit 320 on a substrate 301. Each of the thin film transistor units 310 may include a gate layer 311, a gate insulation layer 312, an active region 315, an etch stop layer 314, and source/drain regions 315, and a passivation layer 316, which may be stacked on the substrate 301. The thin film antenna unit 320 may include a first film 321 stacked on the substrate 201. The first film 321 may be an extension of the gate layer 311. The first film 321 may include a same conductive material as the gate layer 311. The first film 321 may generate an input current in response to an ambient electric field.

When an input current is applied from the thin film antenna unit 320 to the gate layer 311 of each of the two thin film transistor units 310, a respective current flows through each of the active layers 313 facing the gate layers 311 and through the source/drain layers 315, respectively. In such embodiments, since a same sensing signal may be output from the two thin film transistor units 310, an amplified sensing signal may be generated. While the plurality of thin film transistor units 310 illustrated in FIG. 3 may each correspond to the exemplary thin film transistor unit 110 of FIG. 1A, embodiments are not limited thereto. For example, one, some or all of the thin film transistor units 310 may correspond, e.g., to the thin film transistor unit 210 of FIG. 2.

Figure 4:
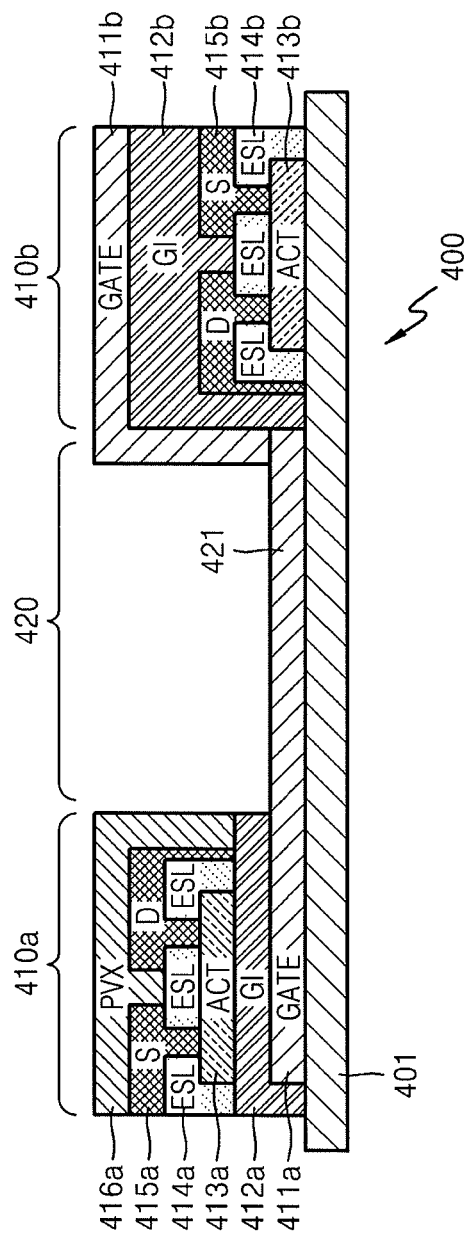
FIG. 4 illustrates a cross-sectional view of a thin film charged body sensor according to another exemplary embodiment.

FIG. 4 illustrates a cross-sectional view of a thin film charged body sensor 400 according to another exemplary embodiment. In general, only differences between the exemplary thin film charged body sensor 400 of FIG. 4 and the thin film charged body sensors 100, 300 of FIGS. 1A and 3 will be described below. More particularly, the thin film charged body sensor 400 of FIG. 4 includes a plurality of thin film transistor units 410a, 410b, e.g., two thin film transistor units, coupled to one thin film antenna unit 420. By providing a plurality of thin film transistor units 410a, 410b, a sensing signal may be amplified.

More particularly, in FIG. 4, two thin film transistor units, e.g., first and second thin film transistor units 410a and 410b, are connected to the thin film antenna unit 420. The first thin film transistor unit 410a may have a bottom gate structure and the second thin film transistor unit 410b may have a top gate structure.

Accordingly, the first thin film transistor unit 410a may have a structure in which a gate layer 411a, a gate insulating layer 412a, an active layer 413a, an etch stop layer 414a, source/drain layers 415a, and a passivation layer 416a are sequentially stacked on a substrate 401. The second thin film transistor unit 410b may have a structure in which an active layer 413b, an etch stop layer 414b, source/drain layers 415b, a gate insulating layer 412b, and a gate layer 411b are sequentially stacked on the substrate 401.

A first film 421 of the thin film antenna unit 420 may be formed as an extension of the gate layer 411a of the first thin film transistor unit 410a. The gate layer 411b of the second thin film transistor unit 410b may be formed to connect to and/or contact the first film 421.

In such embodiments, since a same and/or substantially same sensing signal may be output from the first and second thin film transistor units 410a and 410b as a result of an input current resulting from an effect on an electric field of a movement sensed by the thin film antenna 420, an amplified sensing signal may be provided by the plurality of thin film transistor units 410a, 410b.

Figure 5:
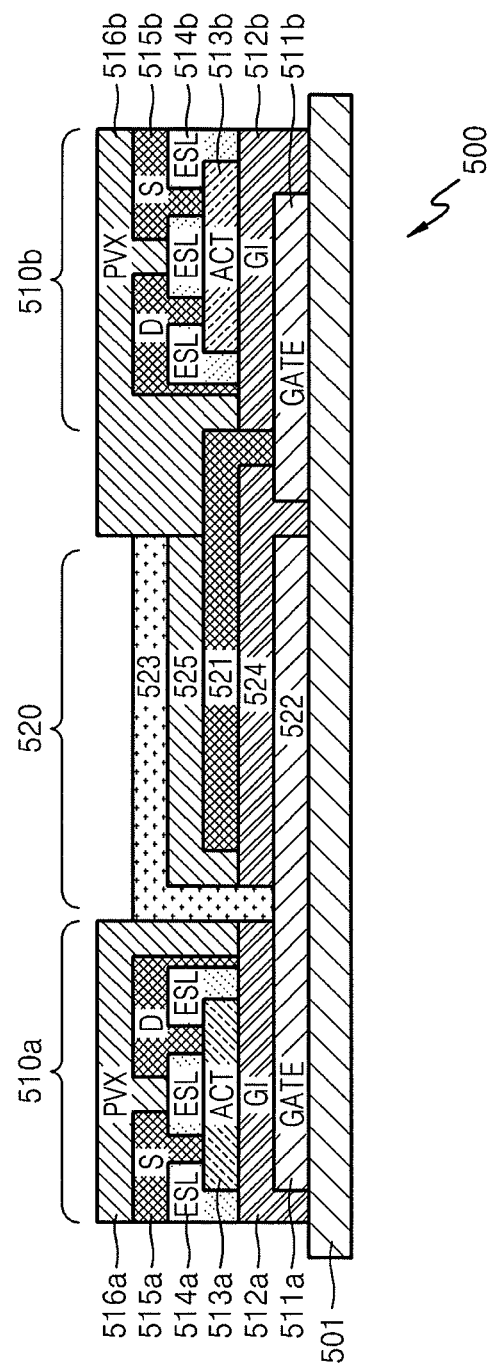
FIG. 5 illustrates a cross-sectional view of a thin film charged body sensor according to another exemplary embodiment.

FIG. 5 illustrates a cross-sectional view of a thin film charged body sensor 500 according to another exemplary embodiment. In general, only differences between the exemplary embodiment of FIG. 5 and the exemplary embodiment of FIG. 1 will be described below.

Referring to FIG. 5, the thin film charged body sensor 500 may include a plurality, e.g., two, of thin film transistor units, e.g., first and second thin film transistor units 510a, 510b and a thin film antenna unit 520. The first and second thin film transistor units 510a, 510b may be connected to the thin film antenna unit 520. The thin film antenna unit 520 may include a plurality of films and a plurality of insulating layers. More particularly, e.g., the thin film antenna unit 520 may include a first film 521, a second film 522, a third film 523, a first insulating layer 524, and a second insulating layer 525. The first, second, and third thin films 521, 522, 523 may include a conductive material. The first insulating layer 524 may be interposed between the second film 522 and the first film 521. The second insulating layer 525 may be interposed between the first film 521 and the third film 523, respectively.

Each of the first and second thin film transistor units 510a, 510b may respectively include a gate layer 511a, 511b, a gate insulating layer 512a, 512b, an active layer 513a, 513b, etch stop layers 514a and 514b, a source/drain layer 515a, 515b, and a passivation layer 516a, 516b, which may be sequentially stacked on a substrate 501. When an input current is applied from the thin film antenna unit 520 to each of the gate layers 511a, 511b, the first and second thin film transistor units 510a, 510b may be turned on.

Referring to FIG. 5, the second film 522 may be an extension of the first gate layer 511a. The second film 522 of the thin film antenna unit 520, and the first and second gate layers 511a, 511b may include a same material, and may be simultaneously formed during a same process. The first insulating layer 524 and the gate insulating layers 512a, 512b may include a same material, and may be simultaneously formed during a same process. The first insulating layer 524 may be formed on the second film 522. The first film 521 and the source/drain layers 515a, 515b may include a same material, and may be simultaneously formed during a same process. The first film 521 may be formed on the first insulating layer 524. The second insulating layer 525 and the passivation layers 516a, 516b may include a same material, and may be simultaneously formed during a same process. The second insulating layer 525 may be formed on the first film 521. The third film 523 may be formed on the second insulating layer 525.

More particularly, referring to FIG. 5, the thin film antenna unit 520 may include the first film 521, the second film 522, and the third film 523. The first film 521 may be disposed between the second film 522 and the third film 523 such that each of the first film 521, the second film 522, and the third film 523 may act as a double antenna. Referring to FIG. 5, the first film 521 may be connected to one of the thin film transistor units, e.g., 510b, and more particularly, to one of the gate layers 511b, and the second and third films 522, 523 may be connected to the other of the thin film transistor units, e.g., 510a, and more particularly, to one of the gate layers 511a. In such embodiments, if a charged body approaches or contacts the thin film antenna unit 520, the first, second, and third films 521, 522, 523 may be affected by an electric field of the charged body and may respectively generate input current, which may correspond to sensing signals that may be output by the thin film transistor units 510a, 510b.

In such embodiments, since a sensitivity difference between the first film 521, the second film 522, and the third film 523 may be determined according to dielectric constants of the first and second insulating layers 524 and 525, embodiments may provide various sensing controls by combining a plurality of the sensing signals corresponding to different sensitivities.

More particularly, e.g., a sensing circuit may be configured in such a manner that the second film 522 and the third film 523 may sense a contact of a charged body and the first film may sense a non-contact approach of a charged body.

Referring to FIG. 5, the third film 523 may include a material, e.g., ITO. If the thin film charged body sensor 500 is employed with a flat panel display device including a pixel electrode (not shown), the third film 523 and the pixel electrode of the flat panel display device may be formed as a same layer and may be simultaneously formed during a same process, i.e., during formation of the pixel electrode of the flat panel display device is formed.

It should be understood that embodiments are not limited to the exemplary embodiments described above or illustrated in the accompanying drawings. For example, although not shown, at least one of the first and second thin film transistors 510a and 510b may have a top gate structure, as shown in FIGS. 2 and 4.

Figure 6:
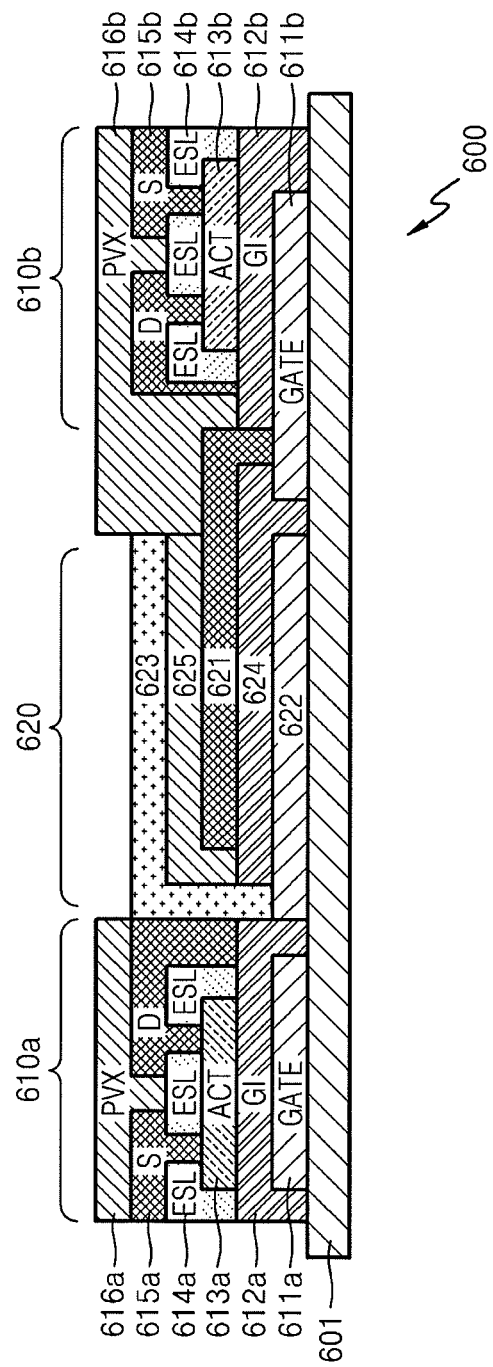
FIG. 6 illustrates a cross-sectional view of a thin film charged body sensor according to another exemplary embodiment.

FIG. 6 illustrates a cross-sectional view of a thin film charged body sensor 600 according to another exemplary embodiment. In general, only differences between the exemplary embodiment of FIG. 6 and the exemplary embodiment of FIG. 5 will be described. The thin film charged body sensor 600 may include a plurality of thin film transistors, e.g., first and second thin film transistors 610a, 610b, and a thin film antenna unit 620.

Referring to FIG. 6, similar to the exemplary embodiment of FIG. 5, first and second thin film transistors 610a and 610b may be connected to one thin film antenna unit 620 in a double antenna structure. Further, similar to the exemplary thin film antenna unit 520 of FIG. 5, the thin film antenna unit 620 may include a plurality of films, e.g., first film 621, a second film 622, and third film 623, and a plurality of insulating layers, e.g., a first insulating layer 624, and a second insulating layer 625. More particularly, the film antenna unit 620 may have a structure in which the second film 622, the first insulating layer 624, the first film 621, the second insulating film 625, and the third film 623 are sequentially stacked on a substrate 601.

Each of the first and second thin film transistor units 610a, 610b may respectively include a gate layer 611a, 611b, a gate insulating layer 612a, 612b, an active layer 613a, 613b, an etch stop layer 614a, 614b, a source/drain layer 615a, 615b, and a passivation layer 616a, 616b, which may be sequentially stacked on the substrate 601.

The second thin film transistor unit 610b may be turned on when an input current is applied from the first film 621 of the thin film antenna unit 620 to the gate layer 611b.

Referring to FIG. 6, in the thin film transistor unit 610 of FIG. 6, the source/drain layers 615a may be connected to the second and/or third films 622, 623. More particularly, in contrast to the exemplary first thin film transistor unit 510a of FIG. 5, in the first thin film transistor unit 610a of FIG. 6, instead of the gate layer 611a, the source/drain layers 615a are connected to the second film 622 and the third film 623 of the thin film antenna unit 620. Accordingly, the first thin film transistor unit 610a may sense a charged body through the thin film antenna unit 620. The first thin film transistor unit 610a may also supply charges to the second film 622 and the third film 623. In such embodiments, a separate gate wire (not shown) may be connected to the gate layer 611a. That is, if a voltage is applied through the separate gate wire to the gate layer 611a, the first thin film transistor unit 610a may be turned on, and a current may flow through the source/drain layers 615a. As a result of such a current through the source/drain layers 615a, charges may be supplied to the second film 622 and the third film 623, and such charges may affect the first film 621. Accordingly, in such embodiments, the first film's 621 sensitivity of sensing an electric field of an external charged body may be changed by controllably varying, i.e., increasing/decreasing, an amount of charge supplied to the second film 622 and the third film 623. Embodiments may enable a sensitivity of the thin film charged body sensor 600 to be adjusted by varying a state of charges within the first, second and/or third films 621, 622, 623 by varying, e.g., supplying or not supplying, a voltage to the gate, i.e., separate gate wire, of the first thin film transistor unit 610a.

Embodiments are not limited to the illustrated features. For example, although not shown, at least one of the first and second thin film transistor units 610a and 610b may be formed to have a top gate structure as shown in FIGS. 2 and 4.

Figure 7A:
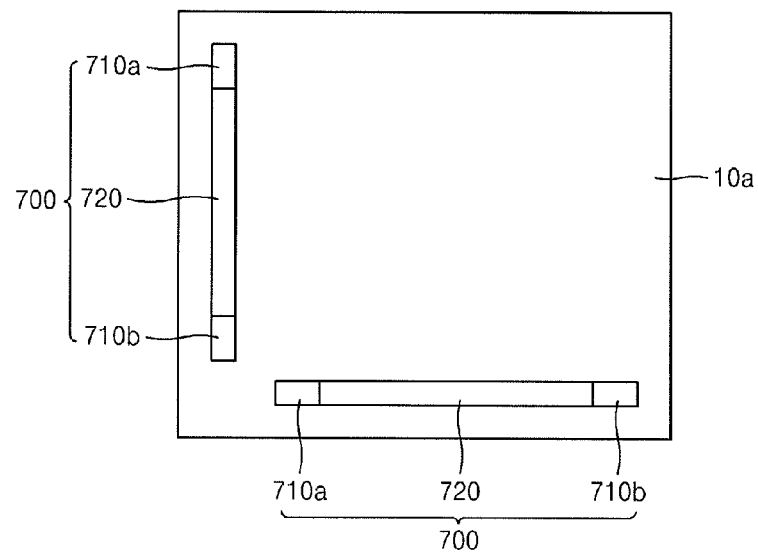
FIGS. 7A and 7B illustrate a cross-sectional view and a top-plan view, respectively, of a panel including a plurality of thin film charged body sensors arranged thereon according to another exemplary embodiment.
Figure 7B:
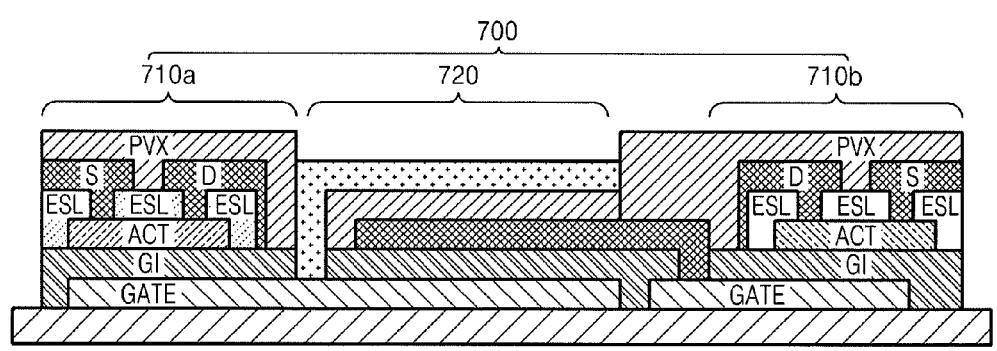

In embodiments, a plurality of thin film charged body sensors, e.g., 100, 200, 300, 400, 500, 600, may be employed together, e.g., on a device, e.g., a display panel 10a. More particularly, e.g., FIGS. 7A and 7B illustrate a cross-sectional view and a top-plan view, respectively, of the display panel 10a including a plurality of thin film charged body sensors 700 arranged thereon according to an exemplary embodiment. More particularly, referring to FIGS. 7A and 7B, a plurality of the thin film charged body sensors 700, e.g., the thin film charged body sensor 500 of FIG. 5, may be arranged on the panel 10a on which a sensing operation may be performed. Each of the thin film charged body sensors 700 may include first and second thin film transistor units 710a, 710b and a thin film antenna unit 720 connected to the first and second thin film transistor units 710a, 710b.

More particularly, e.g., referring to FIG. 7A, one of the plurality of thin film charged body sensors 700 may be arranged so as to extend along a first direction, e.g., horizontal direction, and another of the plurality of thin film charged body sensors 700 may be arranged so as to extend along a second direction, e.g., vertical direction, crossing the first direction. In such embodiments including a plurality of thin film charged body sensors arranged so as to extend along a plurality of different directions, the combination of such thin film charged body sensors may enable increased sensitivity. More particularly, e.g., since two thin film antenna units 720 disposed in different directions may sense a movement of a charged body at different positions, the charged body may be sensed with a higher precision by combining sensing signals. It should be understood that embodiments are not limited thereto. For example, a plurality of each of the thin film charged body sensors 100 through 600 of FIGS. 1 through 6 may be arranged in different directions as shown in FIGS. 7A and 7B, if necessary.

Figure 8A:
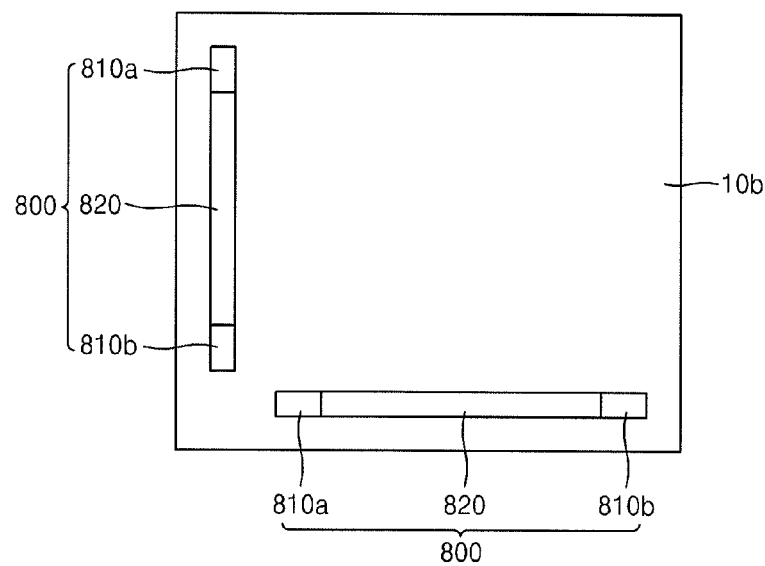
FIGS. 8A and 8B illustrate a cross-sectional view and a top-plan view, respectively, of a panel including a plurality of thin film charged body sensors arranged thereon according to another exemplary embodiment.
Figure 8B:
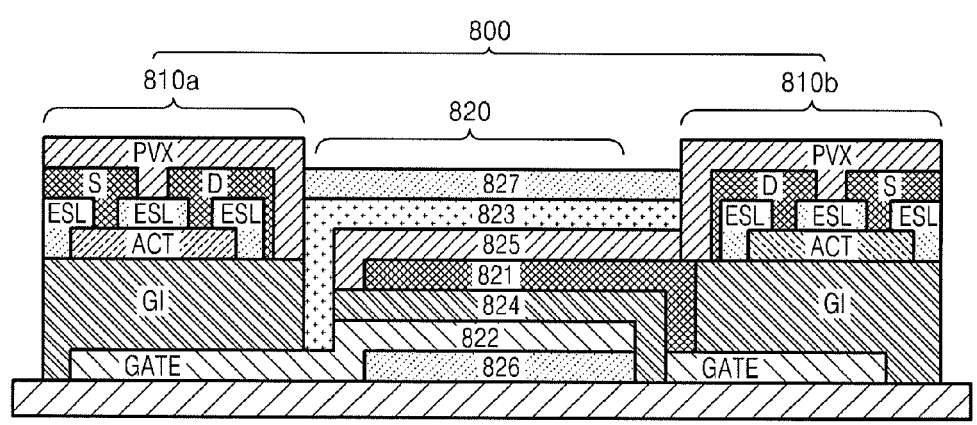

FIGS. 8A and 8B illustrate a cross-sectional view and a top-plan view, respectively, of a display panel 10b including a plurality of thin film charged body sensors 800 arranged thereon according to another exemplary embodiment. Further to the plurality of thin film charged body sensors 700 of FIG. 7, the plurality of thin film charged body sensors 800 of FIGS. 8A and 8B may include third insulating layers 826, 827 as outermost layers of each of thin film antenna units 820. More particularly, the plurality of thin film charged body sensors 800 may be arranged, e.g., to extend in different directions, as discussed above with regard to thin film charged body sensors 700 of FIGS. 7A and 7B. Referring to FIGS. 8A and 8B, the third insulating layers 826, 827 may be formed on outer surfaces of a second film 822 and a third film 823, respectively, of each of the thin film antenna units 820.

Referring to FIGS. 8A and 8B, the second film 822 and the third film 823 may each be covered by the respective third insulating layer 826, 827. That is, e.g., a stacked structure of the first and second insulating layers 824, 825, a first film 821, the second film 822, and the third film 823 on a substrate 10b may be covered by the third insulating layers 826, 227. More particularly, such embodiments may provide a non-contact structure in which all of the first film 821, the second film 822, and the third film 823 may be insulated so as not to contact a charged body may be provided. It should be understood that modifications may be made to this structure, as necessary.

In conventional display devices, separate sensors for sensing a touch based on conventional contact-type input methods are formed and installed on the display device, and such structures are greatly complex and manufacturing costs thereof are relatively high. Also, since such conventional sensors may sense a touch only when users directly touch manipulation units with their fingers, etc., it is generally difficult to feel a smooth sense of manipulation, and the users may feel a burden on their finger joints if they use the manipulation units for a long time.

Embodiments described herein may be advantageous by providing sensors that may be manufactured using a simple process. More particularly, embodiments described herein may be advantageous by providing sensors that may be manufactured using one or more manufacturing processes employed for manufacturing one or more layers of a display on which the sensor is provided.

Embodiments may provide sensors including a relatively smooth sense of manipulation.

As described above, a thin film charged body sensor according to embodiments may include a sensor structure including a thin film antenna unit and a thin film transistor unit that may be easily formed using a simple thin film layer stacking process, and may sense a movement of a charged object in a contact state and/or in a non-contact state by sensing an electric field of the charged body. Embodiments of the thin film charged body sensor may be widely applied to devices through various modifications.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A thin film charged body sensor, comprising:
    a substrate;
    a first thin film transistor unit on the substrate, the first thin film transistor including a gate layer, an active layer insulated from the gate layer, and source/drain layers insulated from the gate layer and connected to the active layer; and
    a thin film antenna unit on the substrate, the thin film antenna unit including a first film including a conductive material electrically connected to the gate layer, the thin film antenna unit adapted to generate an input current in response to an electric field of a charged body.

2. The thin film charged body sensor as claimed in claim 1, wherein the first film and the gate layer include a same material.

3. The thin film charged body sensor as claimed in claim 2, wherein the first film is integrally connected to the gate layer.

4. The thin film charged body sensor as claimed in claim 1, wherein the first film extends from the gate layer.

5. The thin film charged body sensor as claimed in claim 1, wherein the first film and the source/drain layers include a same material.

6. The thin film charged body sensor as claimed in claim 1, further including a second thin film transistor unit,
    wherein the first film is electrically connected to a gate layer of the second thin film transistor unit.

7. The thin film charged body sensor as claimed in claim 1, wherein the thin film antenna unit further includes a second film including a conductive material, the second film being insulated from the first film.

8. The thin film charged body sensor as claimed in claim 7, further including a second thin film transistor unit,
    wherein the second film is electrically connected to a gate layer of the second thin film transistor unit.

9. The thin film charged body sensor as claimed in claim 7, further including a second thin film transistor unit,
    wherein the second film is electrically connected to source/drain layers of the second thin film transistor unit.

10. The thin film charged body sensor as claimed in claim 7, wherein the thin film antenna unit further includes a third film including a conductive material insulated from the first film.

11. The thin film charged body sensor as claimed in claim 10, wherein the second film and the third film are electrically connected to each other.

12. The thin film charged body sensor as claimed in claim 1, wherein a plurality of the thin film antenna units are provided, and a plurality of the thin film transistor units are respectively connected to the plurality of thin film antenna units.

13. The thin film charged body sensor as claimed in claim 12, wherein the plurality of thin film antenna units extend in different directions on a panel on which a sensing operation is performed.

14. The thin film charged body sensor as claimed in claim 1, further including an insulating layer covering the thin film antenna unit.

15. The thin film charged body sensor as claimed in claim 1, wherein the active layer includes an oxide semiconductor.

16. The thin film charged body sensor as claimed in claim 1, wherein the gate layer is under the active layer.

17. The thin film charged body sensor as claimed in claim 1, wherein the gate layer is above the active layer.

18. A display device, comprising:
    a display panel; and
    a thin film charged body sensor, the thin film charged body sensor including:
        a substrate,
        a first thin film transistor unit on the substrate,
        a gate layer,
        an active layer insulated from the gate layer,
        source/drain layers insulated from the gate layer and connected to the active layer, and
        a thin film antenna unit on the substrate, the thin film antenna unit including a first film including a conductive material electrically connected to the gate layer, the thin film antenna unit being adapted to generate an input current in response to an electric field of a charged body.

19. The display device as claimed in claim 18, wherein the first film is integrally connected to the gate layer.

20. The display device as claimed in claim 18, wherein the first film extends from the gate layer.

* * * * *